United States Patent [19]

Sugihara et al.

[11] Patent Number: 5,302,311

[45] Date of Patent: Apr. 12, 1994

[54] CLEANING SOLUTION OF SEMICONDUCTOR SUBSTRATE

[75] Inventors: Yasuo Sugihara; Kazushige Tanaka; Michiya Kawakami, all of Tokyo, Japan

[73] Assignee: Mitsubishi Gas Chemical Company, Inc., Tokyo, Japan

[21] Appl. No.: 927,282

[22] PCT Filed: Feb. 28, 1992

[86] PCT No.: PCT/JP92/00219

§ 371 Date: Sep. 24, 1992

§ 102(e) Date: Sep. 24, 1992

[87] PCT Pub. No.: WO92/16017

PCT Pub. Date: Sep. 17, 1992

[30] Foreign Application Priority Data

Feb. 28, 1991 [JP] Japan .................................. 3-057736

[51] Int. Cl.$^5$ .......................... C11D 7/06; C11D 7/18; C11D 7/32; C11D 7/36

[52] U.S. Cl. .................................. 252/102; 252/103; 252/186.29; 252/541; 252/545; 252/DIG. 11; 423/272; 423/584

[58] Field of Search ........................ 423/273, 584, 272; 252/186.29, 102, 103, 79.1, 79.5

[56] References Cited

U.S. PATENT DOCUMENTS

| | | | |
|---|---|---|---|
| 3,122,417 | 2/1964 | Blaser | 252/99 |
| 3,234,140 | 2/1966 | Irani | 252/186.29 |
| 3,701,825 | 10/1972 | Radimer | 423/273 |
| 4,304,762 | 12/1981 | Leigh | 423/273 |
| 4,497,725 | 2/1985 | Smith | 252/102 |
| 4,614,646 | 9/1986 | Christiansen | 252/186.29 |
| 4,808,259 | 2/1989 | Jillie | 252/79.5 |
| 4,885,106 | 12/1989 | Lapham et al. | 252/100 |
| 5,104,635 | 4/1992 | Kanada | 423/584 |

FOREIGN PATENT DOCUMENTS

| | | |
|---|---|---|
| 0276774 | 8/1988 | European Pat. Off. . |
| 276774 | 8/1988 | European Pat. Off. . |
| 496605 | 7/1992 | European Pat. Off. . |
| 3822350 | 1/1990 | Fed. Rep. of Germany . |
| 5142474 | 10/1974 | Japan ............................ 252/79.5 |
| 50-22721 | 3/1975 | Japan . |
| 61-294824 | 12/1986 | Japan . |
| 63-211724 | 9/1988 | Japan . |
| 1-154523 | 6/1989 | Japan . |
| 2-4991 | 1/1990 | Japan . |
| 2-225684 | 9/1990 | Japan . |
| 3-88703 | 4/1991 | Japan ............................ 423/272 |

OTHER PUBLICATIONS

RCA Review, vol. 31, No. 2, Jun. 1970, Princeton, N.J., pp. 187-206.

*Primary Examiner*—Dennis Albrecht
*Attorney, Agent, or Firm*—Armstrong, Westerman, Hattori, McLeland and Naughton

[57] ABSTRACT

In cleaning a semiconductor substrate with a basic aqueous solution of hydrogen peroxide, it is an object to prevent metal impurities adhering to the substrate surface. A cleaning solution of a semiconductor substrate which comprises a basic aqueous solution of a hydrogen peroxide containing a chelating agent having at least two phosphonic acid groups. Preferred chelating agent is 1,2-propylenediamine tetra(methylene phosphonic acid) in amount of 1 ppb to 1000 ppm, together with 0.1 to 20% by weight of hydrogen peroxide and, optionally, 0.1 to 10% by weight of ammonia. Even if the cleaning solution is contaminated with metal impurities, characteristics of semiconductor elements prepared from a substrate are stabilized since no metal impurities adhere on the substrate surface.

1 Claim, No Drawings

CLEANING SOLUTION OF SEMICONDUCTOR SUBSTRATE

TECHNICAL FIELD

The present invention relates to a cleaning solution for a semiconductor substrate. More specifically, it relates to a cleaning solution of a semiconductor which comprises a basic aqueous solution of hydrogen peroxide containing a chelating agent having at least two phosphonic acid groups.

BACKGROUND ART

In producing semiconductor elements, cleaning has been carried out with chemicals to remove contaminants adhered on a surface of a semiconductor substrate including silicon wafer. As the chemicals, cleaning solutions containing mainly hydrogen peroxide are often used. For example, a mixed aqueous solution of hydrochloric acid and hydrogen peroxide, a mixed aqueous solution of sulfuric acid and hydrogen peroxide, a mixed aqueous solution of ammonia and hydrogen peroxide and the like are known.

Particularly, a mixed aqueous solution of ammonia indicating basicity in an aqueous solution and hydrogen peroxide is most widely used since it is effective in removing fine particles adhered on a substrate surface. However, in a basic cleaning solution, there has been a problem that metal impurities including Fe and Cu come to be insoluble and adhere on a substrate to exert a bad influence on a characteristics of a semiconductor element.

In order to solve the problem, high purification of ammonia and hydrogen peroxide themselves has been promoting. Presently, a concentration of metal impurities in ammonia and hydrogen peroxide leads to 1 ppb or below. However, on the contrary, there has been a problem that a high purified cleaning solution comes to be sensitive to metal contamination from the outside and metal contamination from a cleaning vessel etc., causes instability for characteristics of a semiconductor element.

On the other hand, as the other methods for preventing adhesion of metal impurities to a semiconductor substrate, addition of a chelating agent has been suggested. For example, in German Patent Published No. 3822350, a method of using ethylenediaminetetraacetic acid (EDTA) as a chelating agent has been suggested. However, in fact, advantageous effects due to addition of EDTA are scarcely observed. Accordingly, a method for treatment of rendering stable advantageous effects has been desired.

DISCLOSURE OF THE INVENTION

The object of the present invention is to solve the foregoing problems and provide a cleaning solution which, even if a basic cleaning solution of hydrogen peroxide is contaminated with metal impurities, makes it possible to prevent contaminants adhering to a substrate surface and carry out stabilized cleaning of the substrate.

The present inventors have made extensive study to attain the foregoing object. As a result, it has been found that it is effective to add a chelating agent having at least two phosphonic acid groups. The present invention has been accomplished on the basis of above finding.

Thus, the present invention relates to a cleaning solution of a semiconductor substrate which comprises a basic aqueous solution of hydrogen peroxide containing a chelating agent having at least two phosphonic acid groups.

The chelating agent using in the present invention is not limited except that it is a chelating agent having at least two phosphonic acid groups. The typical examples include aminotri( methylenephosphonic acid). 1-hydroxyethylidene-1, 1-diphosphonic acid, ethylenediaminetetra(methylenephosphonic acid), hexamethlenediaminetetra(methylenephosphonic acid), propylenediaminetetra(methylenephoshonic acid), diethylenetriaminepenta(methylenephosphonic acid), triethylenetetraminehexa(methylenephosphonic acid), triaminotriethylaminehexa(methylenephoshonic acid), trans-1,2-cyclohexanediaminetetra(methylenephosphonic acid), glycoletherdiaminetetra(methylenephosphonic acid), and tetraethylenepentaminehepta(methylenephosphonic acid) etc.

Among them, ethylenediaminetetra (methylenephosphonic acid), propylenediaminetetra(methylenephosphonic acid) and the like having a strong chelating force, are particularly preferable. The chelating agent using in the present invention is desirably used in the form of free acid. When solubility is insufficient, it may be used also in the form of salt including ammonium salt.

Although an addition amount of the chelating agent in the present invention is not particularly limited, it depends on the contents or degree of contamination of metal impurities, or kinds of basic compounds in a basic cleaning solution of hydrogen peroxide. Ordinarily, it is in the range of 1 ppb to 1,000ppm for the total amount of the cleaning solution.

After a basic cleaning solution of hydrogen peroxide has been prepared, the chelating agent may be added to it. Otherwise, the chelating agent may be in advance added to ammonia, organic amine, hydrogen peroxide, water etc., and subsequently mixed with them. Ordinarily, after a basic cleaning solution of hydrogen peroxide has been prepared, the chelating agent is added to it.

The basic cleaning solution of hydrogen peroxide in the present invention is typically a mixed aqueous solution of ammonia and hydrogen peroxide. The other examples include a mixed aqueous solution of organic amines including choline( hydroxyltrimethylammoniumhydroxide), tetramethylammoniumhydroxide, tetraethylammoniumhydroxide and hydrogen peroxide. In the case of a basic cleaning solution comprising a mixed aqueous solution of ammonia and hydrogen peroxide, ammonia in the range of a concentration of 0.1 to 10% by weight and hydrogen peroxide in the range of a concentration of 0.1 to 20% by weight are ordinarily used. In the case of a mixed aqueous solution of the other organic amine and hydrogen peroxide, organic amine in the range of a concentration of 0.01 to 10% by weight and hydrogen peroxide in the range of a concentration of 0.1 to 20% by weight are ordinarily used. Moreover, although the chelating agent in the present invention need not be added to an acidic cleaning solution including a mixed aqueous solution of hydrochloric acid and hydrogen peroxide, it is no problem to add it.

BEST MODE FOR CARRYING OUT THE INVENTION

Example 1

A preliminary cleaned silicon substrate of 3 inch was immersed to clean at 85 for 10 minutes in a basic cleaning solution prepared by adding 1 ppm of ethylenediaminetetra (methylenephosphonic acid ) to a mixed solution wherein a proportion of high purity of ammonium (28% by weight), a high purity of hydrogen peroxide (30% by weight) and ultra purity of water was 1:4:20 (volume ratio).

The cleaned substrate was oxidized in an oxygen gas stream to grow an oxide film to a thickness of about 350A. Thus, MOS diode was made. As an electrical characteristic thereof, minority carrier surface generation velocity was measured. The same operation was repeated five times. The results were shown in table 1. As shown in table 1, it became possible to carry out stabilized cleaning. Moreover, valuses of minority carrier surface generation velocity were more remarkably improved than those in the comparative Example of not adding the chelating agent of the present invention and random of the values decreased.

TABLE 1

| Experimental times | Surface generation velocity (cm/sec) |
| --- | --- |
| 1 | $2.8 \times 10^{-2}$ |
| 2 | $3.3 \times 10^{-2}$ |
| 3 | $2.5 \times 10^{-2}$ |
| 4 | $2.8 \times 10^{-2}$ |
| 5 | $3.2 \times 10^{-2}$ |

Comparative Example

A preliminary cleaned silicon substrate of 3 inch was immersed to clean at 85° C. for 10 minutes in a basic cleaning solution wherein a proportion of high purity of ammonia (28% by weight), a high purity of hydrogen peroxide (30% by weight) and ultra purity of water was 1:4:20(volume ratio).

The cleaned substrate was treated in the same manner as in Example 1 to make MOS diode having an oxide film. As an electrical characteristic thereof, minority carrier surface generation velocity was measured. The results were shown in table 2.

TABLE 2

| Experimental times | Surface generation velocity (cm/sec) |
| --- | --- |
| 1 | $6.9 \times 10^{-2}$ |
| 2 | $8.8 \times 10^{-2}$ |
| 3 | $9.4 \times 10^{-2}$ |
| 4 | $4.9 \times 10^{-2}$ |
| 5 | $6.4 \times 10^{-2}$ |

Example 2

In order to research influence of metal impurities and preventing effects of a chelating agent, the basic cleaning solutions shown in table 3 were prepared and used. Operation was carried out in the same manner as in Example 1. As an electrical characteristic, minority carrier generation lifetime was measured. Moreover, in order to confirm that influence on electrical characteristics dues to metal impurities, an amount of metal impurities adhered on a substrate was analyzed by TREX (Total Reilection Energy dispersive X-ray fluorescence )apparatus.

By adding 10 ppb of iron ion, iron adhered on the substrate surface and minority carrier generation lifetime also remarkably decreased. However, by adding simultaneously propylenediaminetetra( methylenephosphonic acid ) (PDTMP), adhesion of iron was prevented and decrease of minority carrier generation lifetime also was not observed.

Moreover, by adding ethylenediaminetetraacetic acid (EDTA), no preventing effect was observed.

TABLE 3

| Test No. | basic cleaning solution | Fe adhered amount (atoms/cm$^2$) | generation lifetime (sec) |
| --- | --- | --- | --- |
| (1) | NH$_4$OH/H$_2$O$_2$/water | $3 \times 10^{10}$ | $5.5 \times 10^{-4}$ |
| (2) | Fe 10 ppb was added to NH$_4$OH/H$_2$O$_2$/water | $135 \times 10^{10}$ | $0.2 \times 10^{-4}$ |
| (3) | Fe 10 ppb and PDTMP 1 ppm were added to NH$_4$OH/H$_2$O$_2$/water | $3 \times 10^{10}$ | $6.3 \times 10^{-4}$ |
| (4) | Fe 10 ppb and EDTA 1 ppm were added to NH$_4$OH/H$_2$O$_2$/water | $130 \times 10^{10}$ | $0.2 \times 10^{-4}$ |

(Note) NH$_4$OH/H$_2$O$_2$/water = 1/4/20 (volume ratio)

INDUSTRIAL APPLICABILITY

According to the cleaning solution of the present invention, even if the basic cleaning solution is contaminated with metal impurities, contamination of a semiconductor substrate surface is effectively prevented and stabilized cleaning of the semiconductor substrate can be carried out, so that a defective proportion of elements decreases and it is possible to produce superior semiconductor elements.

We claim:

1. A cleaning solution for a semiconductor substrate which comprises a basic aqueous solution containing 0.1 to 20% by weight of hydrogen peroxide, 0.1 to 10% by weight of ammonia and 1 ppb to 1000 ppm of 1,2 propylenediamine tetra (methylenephosphonic acid).

* * * * *